(12) United States Patent
Uchimi

(10) Patent No.: US 6,629,471 B2
(45) Date of Patent: Oct. 7, 2003

(54) X-Y STAGE APPARATUS CAPABLE OF REDUCING THE NUMBER OF DRIVE SOURCES

(75) Inventor: Kazuharu Uchimi, Tokyo (JP)

(73) Assignee: Sumitomo Heavy Industries, Ltd., Tokyo (JP)

(*) Notice: Subject to any disclaimer, the term of this patent is extended or adjusted under 35 U.S.C. 154(b) by 0 days.

(21) Appl. No.: 10/020,889

(22) Filed: Dec. 19, 2001

(65) Prior Publication Data

US 2003/0113043 A1 Jun. 19, 2003

(51) Int. Cl.7 .............................................. G05G 11/00
(52) U.S. Cl. ................................. 74/490.09; 74/490.13
(58) Field of Search ..................... 384/12; 74/490.07, 74/490.09, 490.13

(56) References Cited

U.S. PATENT DOCUMENTS 6,134,981 A * 10/2000 Navak et al. ............ 74/490.09
6,363,809 B1 * 4/2002 Novak et al. ............ 74/490.09

FOREIGN PATENT DOCUMENTS

| JP | 1-188242 | 7/1989 |
| JP | 7-285044 | 10/1995 |
| JP | 2000-155186 | 6/2000 |

* cited by examiner

Primary Examiner—Christopher P. Schwartz
(74) Attorney, Agent, or Firm—Arent Fox Kintner Plotkin & Kahn, PLLC

(57) ABSTRACT

A first slider moves along a guide rail extending in a Y-axis direction and includes a beam extending in an X-axis direction, a T-shaped section, and an arm member. The T-shaped section moves along the guide rail at an end of the beam. The arm member extends in the Y-axis direction at the other end of the beam. A second slider moves in the X-axis direction along the beam. The first slider is supported on the base by static pressure air bearing pads disposed at two positions on the lower surface of the T-shaped section, at at least one position on the lower surface of the beam at the central portion thereof and at the two positions on the lower surface of the arm member. The second slider is supported on the base by static pressure air bearing pads disposed at three positions on the lower surface thereof.

7 Claims, 4 Drawing Sheets

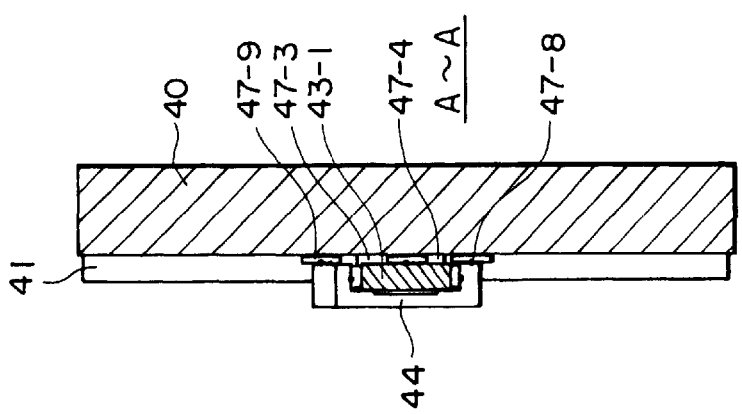
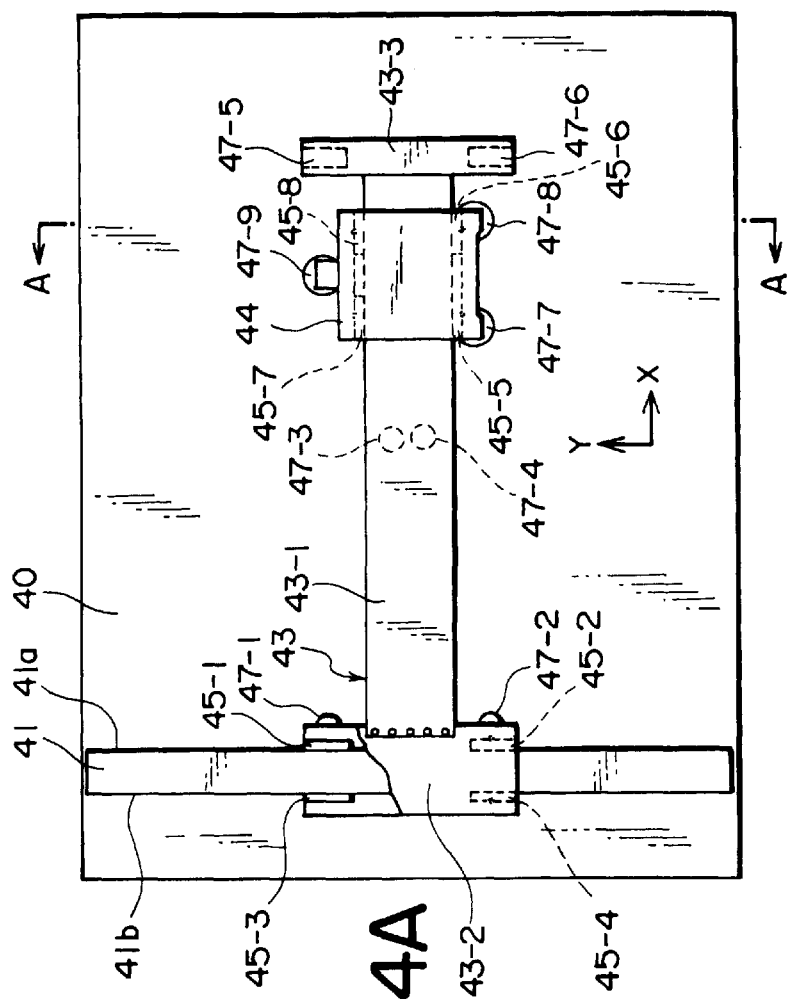
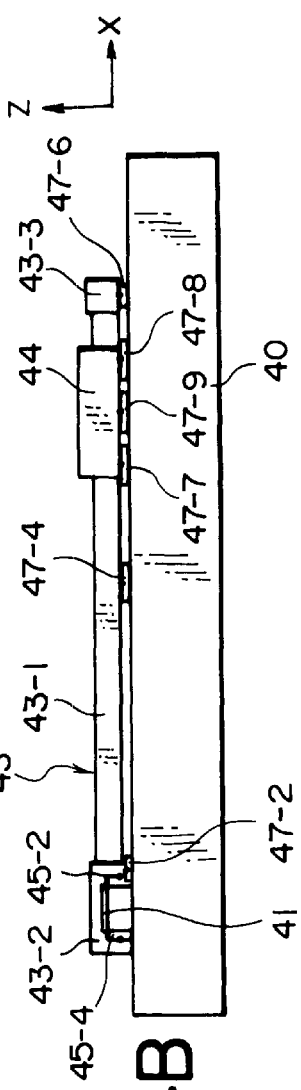

X-Y STAGE APPARATUS CAPABLE OF REDUCING THE NUMBER OF DRIVE SOURCES

BACKGROUND OF THE INVENTION

1. Field of the Invention

The present invention relates to an X-Y stage apparatus having a stage on which a workpiece is placed and which can move in X- and Y-directions.

2. Description of the Related Art

Referring to FIG. 1, a stage apparatus on which a moving body 12 can move only in one axial direction will be described. This stage apparatus employs a static pressure air bearing (not shown). A beam 11 is fixed on a base 10. The moving body 12 is combined with the beam 11. The moving body 12 can move along the beam 11 acting as a guide. The moving body 12 is realized by, for example, the movable section of a linear motor. The beam 11 and the moving body 12 are composed of a material such as ceramics which has high rigidity and the dimension of which can be easily managed.

Next, an X-Y stage apparatus using static pressure air bearings (not shown) will be described with reference to FIG. 2. In FIG. 2, two guide rails 13 and 14 are disposed on a base 10 at a predetermined interval. Moving bodies 15 and 16 are combined with the guide rails 13 and 14, respectively. The moving bodies 15 and 16 can move along the guide rails 13 and 14, respectively. The moving bodies 15 and 16 are connected to each other through the beam 11. As a result, when the moving bodies 15 and 16 move along the guide rails 13 and 14, the beam 11 also moves. A moving body 12 is combined with the beam 11. The moving body 12 can move along the beam 11 acting as a guide. Each of the moving bodies 12, 15, and 16 is realized by the movable section of a linear motor.

Incidentally, there is a tendency that the size of X-Y stage apparatuses increases. In the X-Y stage apparatus shown in FIG. 2, the length of the beam 11 is increased to increase the amount of movement (stroke) of the moving body 12. Further, the mass of a workpiece placed on the moving body 12 is also increased. As a result, the amount of flexure of the beam 11 cannot be neglected. When the beam 11 is flexed, the moving body 12 cannot move smoothly.

In the X-Y stage apparatus shown in FIG. 2, it is impossible for a support member to support the beam 11 at the center thereof to minimize the amount of flexure of the beam 11. This is because that the four surfaces of the beam 11 around the periphery thereof act as guide surfaces. That is, the support member cannot be interposed between the base 10 and the beam 11. Further, since the beam 11 itself moves in the same direction as those of the guide rails 13 and 14, the support member must be moved following the movement of the beam 11.

An X-Y stage apparatus proposed by the inventors will be described with reference to FIG. 3. The X-Y stage apparatus is disclosed in Japanese Unexamined Patent Publication No. 2000-155186.

The fixed sections of the X-Y stage apparatus are a base 20 having an upper surface of which acts as a guide surface, and guide rails 21 and 22 which are fixed on the base 20 at an interval. FIG. 3 shows the three directions of X-, Y-, and Z-axes that are orthogonal to each other. The guide rails 21 and 22. have guide surfaces 21 a and 22a that extend in the Y-axis direction and face to each other. In this X-Y stage apparatus, the movable sections that are linearly guided along the guide surfaces 21a and 22a in the Y-axis direction are-a Y-slider 23, static pressure air bearing pads 25-1, 25-2. 25-3, and 25-4 and static pressure air bearing pads 27-1, 27-2, and 27-3. The Y-slider 23 is interposed between the guide rails 21 and 22 and includes a beam 23-1 extending in the X-axis direction and T-shaped sections 23-2 at both ends of the beam 23-1.

The static pressure air bearing pads 25-1 to 25-4 are disposed on sides of the two T-shaped sections 23-2 of the Y-slider 23 through couplings (not shown) each having a one-degree-of-freedom about the rotation around the Z-axis, respectively. The static pressure air bearing pads 25-1 and 25-2 eject compressed air onto the guide surface 21a, and the static pressure air-,bearing pads 25-3 and 25-4 eject compressed air onto the guide surface 22a. The static pressure air bearing pads 27-1 and 27-2 are disposed on the lower surface of the T-shaped section 23-2 at one end of the beam 23-1, and the static pressure air bearing pad 27-3 is disposed on the lower surface of the beam 23-1 at the other end thereof. The static pressure air bearing pads 27-1 to 27-3 eject compressed air onto the upper surface of the base 20.

Note that the static pressure air bearing pads 27-1 and 27-2 are disposed at positions that are approximately symmetrical with respect to the central axis of the Y-slider 23, that is, the central axis of the beam 23-1. In contrast, the static pressure air bearing pad 27-3 is disposed at a position corresponding to the central axis of the Y-slider 23. That is, the static pressure air bearing pads 27-1, 27-2, and 27-3 are disposed such that the line segments that connect the centers of them form an isosceles triangle.

Further, in FIG. 3, the movable sections, which are linearly guided in the X-axis direction while being also linearly guided in the Y-axis direction, are an X-slider 24, static pressure air bearing pads 25-5, 25-6, 25-7, and 25-8 and static pressure air bearing pads 27-4, 27-5, and 27-6. The X-slider 24 is combined with the Y-slider 23 so as to move along the beam 23-1. The beam 23-1 has a square cross section including two side surfaces each extending in the X-axis direction. The X-slider 24 has an approximately inverted-U-shaped cross section having two inner surfaces facing the two side surfaces of the beam 23-1 of the Y-slider 23. The static pressure air bearing pads 25-5 to 25-8 are disposed on the two inner surfaces of the X-slider 24 through couplings (not shown) each having a one-degree-of-freedom about the rotation around the z-axis. The static pressure air bearing pads 27-4 to 27-6 are disposed on the lower surface of the X-slider 24. In the Y-slider 23, the two side surfaces of the beam 23-1 extending in the X-axis direction are formed as reference surfaces for guiding the X-slider 24. The static pressure air bearing pads 25-5 to 25-8 eject compressed air onto the side surfaces of the beam 23-1. The static pressure air bearing pads 27-4 to 27-6 eject compressed air onto the upper surface of the base 20.

The X-Y stage apparatus employs a pair of linear motors 31 as the drive source of the Y-slider 23. One of the linear motors 31 is arranged between the guide rail 21 and the Y-slider 23, and the other of them is interposed between the guide rail 22 and the Y-slider 23. In contrast, a linear motor 32 is arranged between the Y-slider 23 and the X-slider 24 and used as the drive source of the X-slider 24. The linear motors 31 and 32 have the same known structure. Thus, one of the linear motors 31 will be described briefly. The linear motor 31 is arranged such that movable coils (not shown) extending from the T-shaped section 23-2 of the Y-slider 23 are disposed in the gap formed between a multiplicity of upper permanent magnets 31-1 disposed in the Y-axis direction and a multiplicity of lower permanent magnets 31-2 disposed in the Y-axis direction.

In the X-Y stage apparatus, a combination of a linear scale and a linear sensor is necessary to each linear motor so as to act as a position sensor for position control, in addition to the above components. Further, a synchronous control system is also necessary to drive the pair of linear motors 31 in synchronism. Furthermore, power supply lines for the linear motors of the moving Y- and X-sliders 23 and 24, signal wires for the sensor, and air pipings for static pressure air bearings are necessary. All of them are made flexible and accommodated in flexible piping. Then, the X-slider 24 is connected to the Y-slider 23 through flexible piping for the X-slider, and the Y-slider 23 is connected to the base 20 through flexible piping for the X- and Y-sliders.

In any case, in the X-Y stage apparatus as shown in FIG. 3, the two drive sources are necessary as the drive source in the Y-axis direction. Further, the synchronous control system is necessary to synchronize the two drive sources. This means that the X-Y stage apparatus is expensive.

SUMMARY OF THE INVENTION

Accordingly, an object of the present invention is to provide an X-Y stage apparatus capable of reducing the number of drive sources.

An X-Y stage apparatus of-the present invention includes a base, a guide rail fixed on the base so as to-ex-tend-in-a first predetermined direction, and a first slider movable in-the first direction along the guide rail. The first slider includes a beam, a T-shaped section, and an arm member. The beam is disposed in parallel with the upper surface of the base and extends in a second direction orthogonal to the first direction. The T-shaped section is movable along the guide rail at an end of the beam. The arm member extends in the first direction at the other end of the beam. The X-Y stage apparatus further includes a second slider movable along the beam in the second direction.

According to an aspect of the present-invention, the first-slider is supported movably on the base by a plurality of first static pressure air bearing pads that are disposed at two positions on the-lower surface of the T-shaped section, at at least one position on the lower surface of the beam at the central portion thereof, and at two positions on the lower surface of the arm member. In contrast, the second slider is supported movably on the base by a plurality of second static pressure air bearing pads disposed at a plurality of positions on the lower surface thereof.

BRIEF DESCRIPTION OF THE DRAWINGS

FIGS. 4A, 4B, and 4C are a plan view, a front elevational view, and a side elevational view of an embodiment of the present invention, respectively.

DESCRIPTION OF THE PREFERRED EMBODIMENTS

Figure 1:
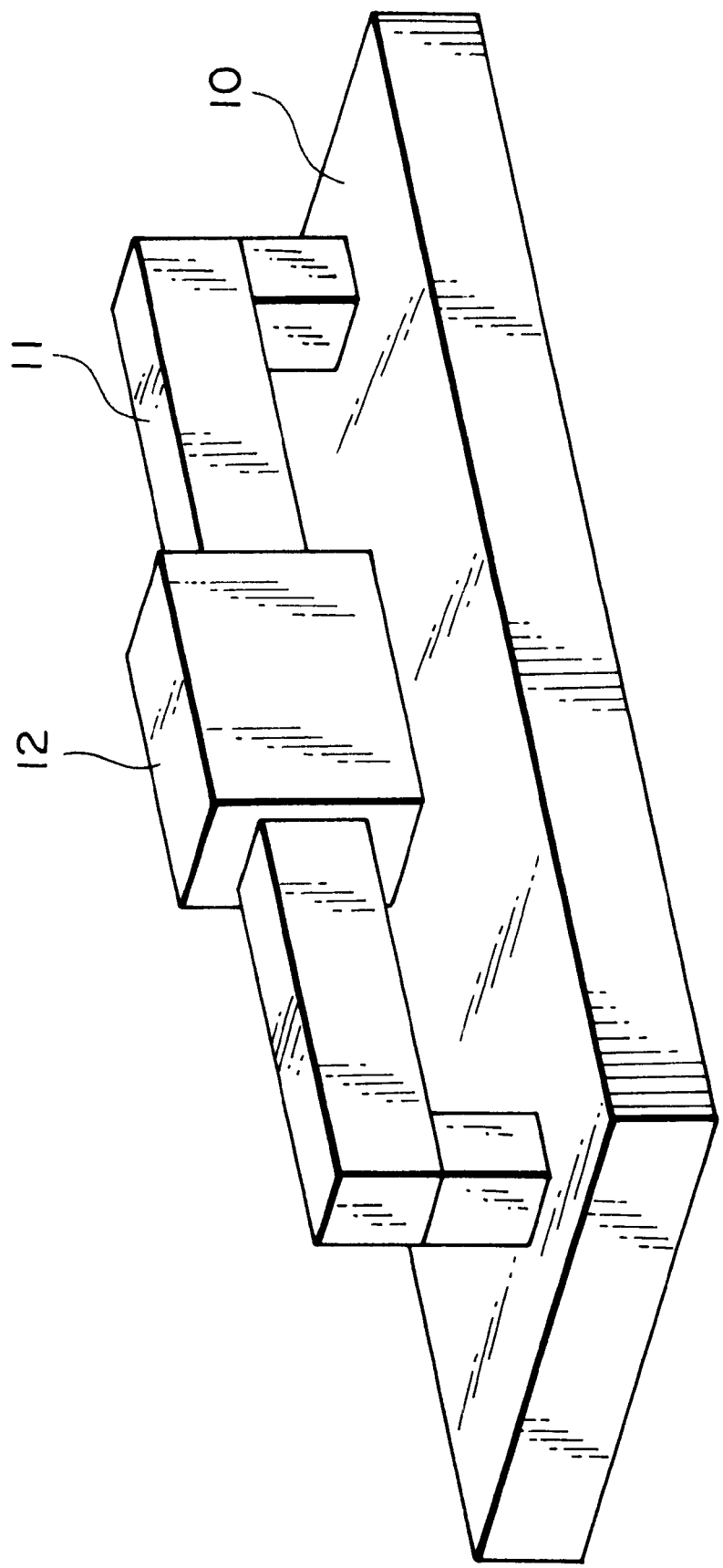
FIG. 1 is a view showing an example of a conventional one-axis stage apparatus.
Figure 2:
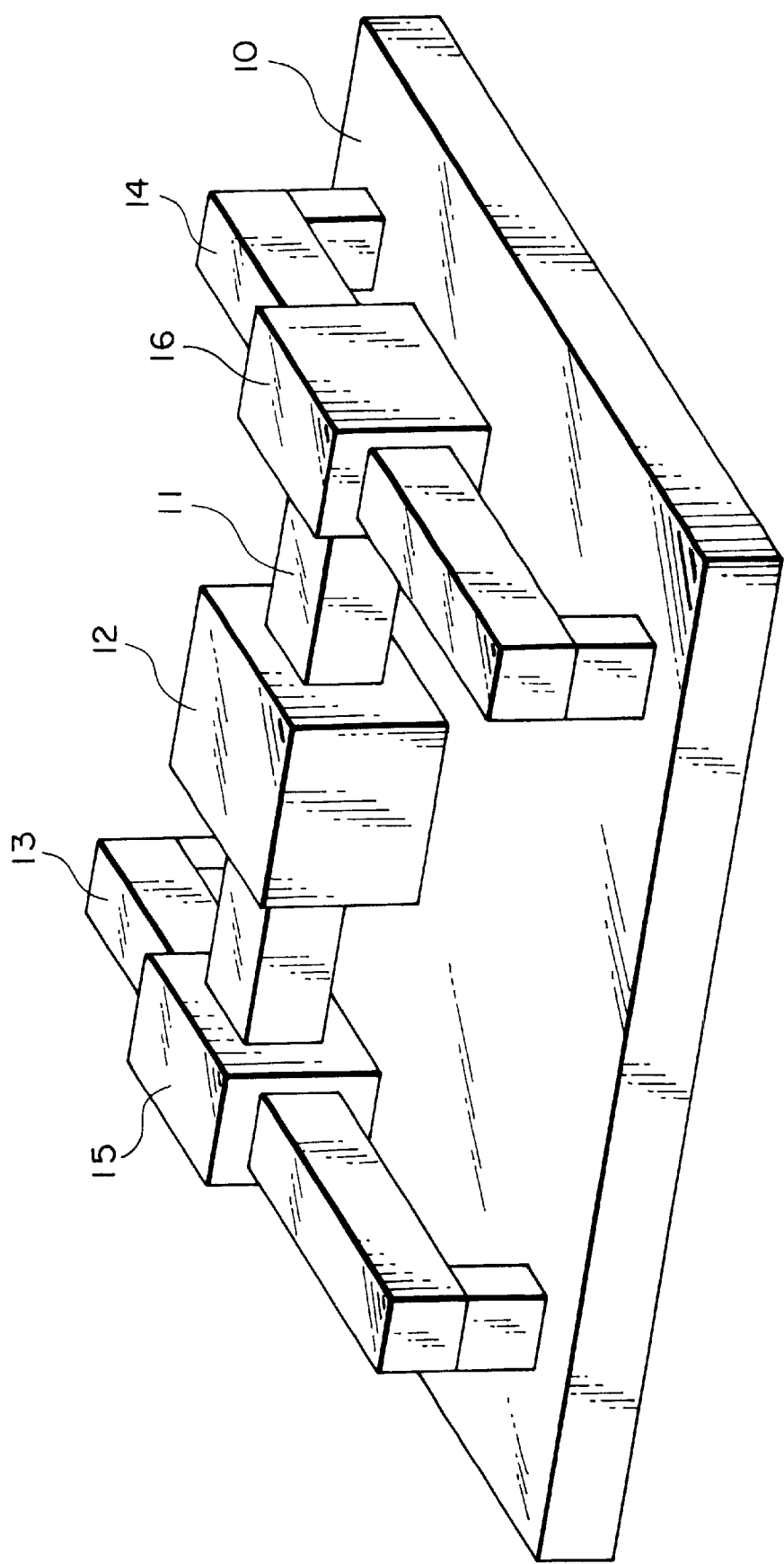
FIG. 2 is a view showing an example of a conventional X-Y stage apparatus.
Figure 3:
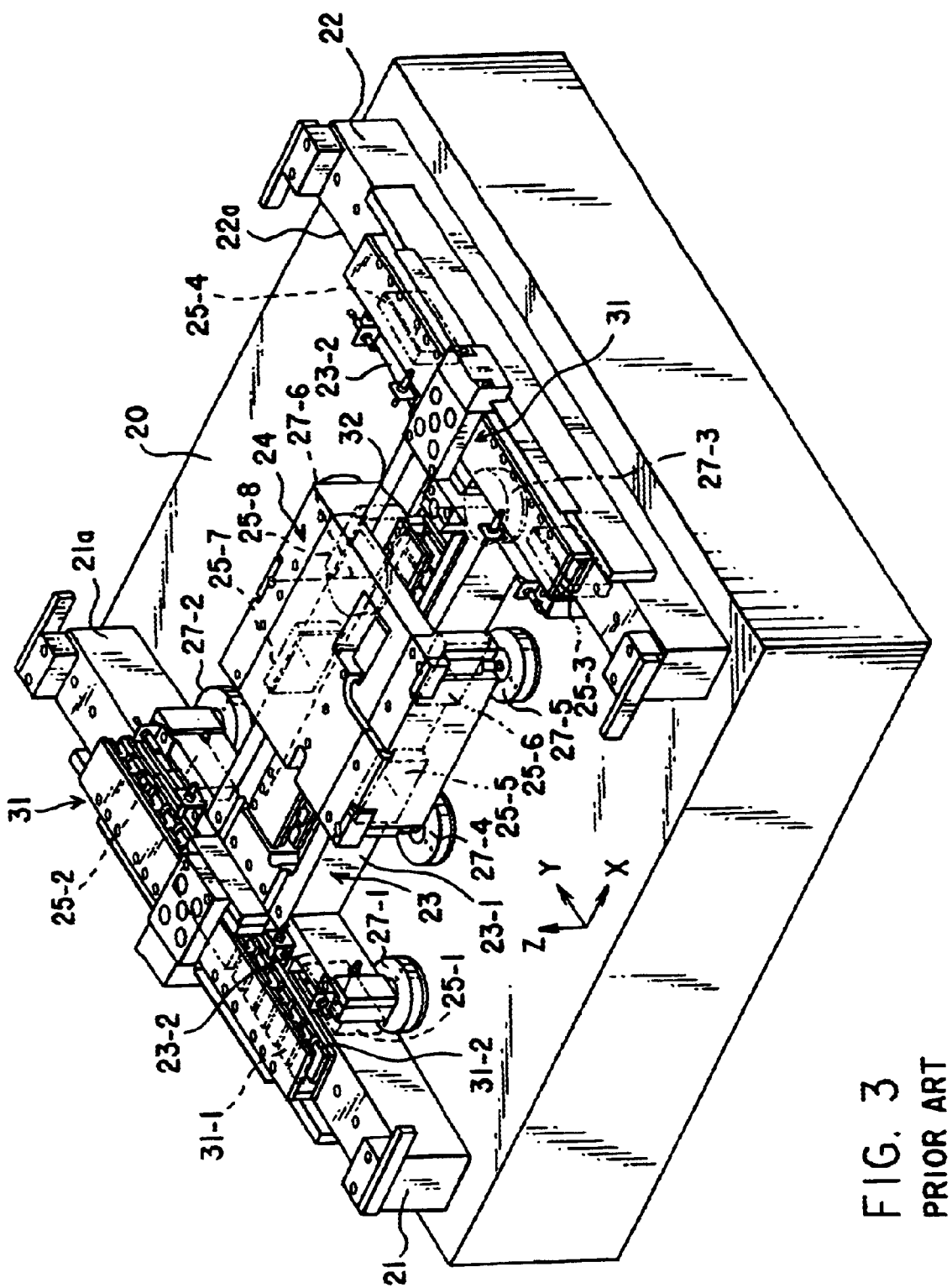
FIG. 3 is a view showing an X-Y stage apparatus proposed by the inventors.

An X-Y stage apparatus according to an embodiment of the present invention will be described with reference to FIGS. 4A, 4B, and 4C. The X-Y stage apparatus according to the embodiment includes an X-slider and a Y-slider as described above with reference to FIG. 3. However, the X-Y stage apparatus has only one guide rail for guiding the Y-slider. Accordingly, only one drive source is used to-drive the Y-slider.

The fixed sections of the X-Y stage apparatus are a base 40 having the upper surface of which acts as a guide surface and a guide rail 41 fixed on the base 40. FIG. 4A shows the two directions of X- and Y-axes that are orthogonal to each other, and FIG. 4B shows the two directions of the X- and Z-axes that are orthogonal to each other. The guide rail 41 has a square cross section including two side surfaces each extending in the Y-axis direction (first direction). These two side surfaces act as guide surfaces 41a and 41b. In FIG. 4A, movable sections are linearly guided in the Y-axis direction along the guide surfaces 41a and 41b and include a Y-slider (first slider) 43, a plurality of static pressure air bearing pads (third static pressure air bearing units) 45-1, 452, 45-3, and 45-4, and a plurality of static pressure air bearing pads (first static pressure air bearing units) 47-1, 47-2, 47-3, 47-4, 47-5, and 47-6.

The Y-slider 43 includes a beam 43-1, a T-shaped section 43-2, and an arm member 43-3. The beam 43-1 is in parallel with the upper surface of the base 40 and extends in the X-axis direction, the T-shaped section 43-2 can move along the guide rail 41 at an end of the beam 43-1, and the arm member 43-3 extends in the Y-axis direction at the other end of the beam 43-1. The T-shaped section 43-2 has an approximately inverted-U-shaped cross section including two inner surfaces facing the two side surfaces of the guide rail 41. That is, the two inner surfaces of the T-shaped section 43-2 face the guide surfaces 41a and 41b of the guide rail 41. The static pressure air bearing pads 45-1 to 45-4 are disposed on the two inner surfaces of the T-shaped section 43-2 through couplings (not shown) each having a one-degree-of-freedom about the rotation around the Z-axis.

The static pressure air bearing pads 47-1 and 47-2 are disposed on the lower surface of the T-shaped section 43-2 of the Y-slider 43. The static pressure air bearing pads 47-3 and 47-4 are disposed on the lower surface of the beam 43-1 in the width direction thereof at an interval. The static pressure air bearing pads 47-5 and 47-6 are disposed on the lower surface of the arm member 43-3. The static pressure air bearing pads 45-1 to 45-4 eject compressed air onto the guide surfaces 41a and 41b , respectively, and the static pressure air bearing pads 47-1 to 47-6 eject compressed air onto the upper surface of the base 40.

Note that the static pressure air bearing pads 47-1 and 47-2 are disposed at positions that are approximately symmetrical with respect to the central axis of the beam 43-1. The static pressure air bearing pads 47-5 to 476 are also disposed similarly to the above air bearing pads. In contrast, the static pressure air bearing pads 47-3 and 47-4 are disposed at positions corresponding to the central position of the beam 43-1.

In FIG. 4A, the movable sections, which are linearly guided in the X-axis direction (second direction) while being also linearly guided in the Y-axis direction are an X-slider (second slider) 44, a plurality of static pressure air bearings (fourth static pressure air bearing units) 45-5, 45-6, 45-7, and 45-8, and a plurality of static pressure air bearings (second static pressure air bearing units) 47-7, 47-8, and 47-9. The X-slider 44 is combined with the Y-slider 43 so as to move along the beam 43-1. The beam 43-1 has a square cross section including two side surfaces each extending in the X-axis direction. The X-slider 44 has an approximately inverted-U-shaped cross section including two inner surfaces facing the two side surfaces of the beam 23-1. That is, in the Y-slider 23, the two side surfaces of the beam 43-1 extending in the X-axis direction are formed as reference surfaces for guiding the X-slider 44.

The static pressure air bearing pads 45-5 to 45-8 are disposed on the two inner surfaces of the X-slider 44 through couplings (not shown) each having a one-degree-of-freedom about the rotation around the z-axis. The static pressure air bearing pads 47-7 to 47-9 are disposed on the lower surface of the X-slider 44. It is preferable that the static pressure air bearing pads 47-7 to 479 be disposed on the lower surface of the X-slider 44 at positions corresponding to the apexes of a regular triangle. The static pressure air bearing pads 45-5 to 45-8 eject compressed air onto the side surfaces of the beam 43-1. The static pressure air bearing pads 47-6 to 47-9 eject compressed air onto the upper surface of the base 40.

In the X-Y stage apparatus, a single linear motor (first drive source) arranged between the guide rail 41 and the T-shaped section 43-2 is used as the drive source of the Y-slider 43. In contrast, a single linear motor 32 (second drive source) is arranged between the Y-slider 43 and the X-slider 44 as the drive source of the X-slider 44. Since these linear motors have the same structure and are the same as those described in FIG. 3, the description thereof is omitted.

As described above, each linear motor includes a combination of a linear scale and a linear sensor as a position detection sensor for position control also in the X-Y stage apparatus, in addition to the above components. Further, power supply lines to the linear motors of the moving Y- and X-slider 43 and 44, signal wires for the sensor, and air pipings to the static pressure air bearings are disposed. All of them are made flexible and accommodated in flexible piping. Then, the X-slider 44 is connected to the Y-slider 43 through flexible piping for the X-slider 24, and the Y-slider 43 is connected to the base 40 through flexible piping for the X-slider and the Y-slider.

In any way, the above arrangement permits the beam 43-1 to be supported by the two static pressure air bearing pads 47-3 and 47-4. That is, the static pressure air bearing pads 47-3 and 47-4 support the load of the beam 43-1 while following the movement of the beam 43-1 over an entire stroke in the X- and Y-axes directions without disturbing the movement of the X-slider 44. With this operation, the flexure of the beam 43-1 can be prevented. Note that a single static pressure air bearing pad may be disposed at the central portion of the beam 43-1. However, when the two static pressure air bearing pads 473 and 47-4 are disposed, an effect of preventing the rotation of the beam 43-1 around the X-axis, that is, the twist of the beam 43-1 can be prevented. Note that the two static pressure air bearing pads 47-3 and 47-4 may be disposed at the central portion of the beam 43-1 in the X-axis direction, namely, the length direction of the beam 43-1, at an interval. In this case, the flexure preventing effect of the beam 43-1 can be more improved.

While the linear motor is used as the drive source in the embodiment described above, other drive source, for example, a fluid pressure actuator, in particular, an air pressure actuator may be used in place of the linear motor.

As described above, since only one linear motor is used as the drive source in the Y-axis direction, the cost of the X-Y stage apparatus can be reduced. In the present invention, since the static pressure air bearing pads are disposed at the central portion of the beam of the Y-slider so as to support the beam at the central portion, the flexure and torsion of the beam can be prevented, and thereby the movable sections can be smoothly moved. A time required to assemble and adjust the X-Y stage apparatus can be reduced in the present invention because it is not necessary to worry about flexure, which permits the cost of the X-Y stage apparatus to be reduced.

What is claimed is:

1. An X-Y stage apparatus, comprising:
 a base;
 a guide rail fixed on the base and extending in a first predetermined direction;
 a first slider movable in the first direction along the guide rail, the first slider comprising a beam, a T-shaped section, and an arm member, the beam being in parallel with the upper surface of the base and extending in a second direction orthogonal to the first direction, the T-shaped section being movable along the guide rail at an end of the beam, and the arm member extending in the first direction at the other end of the beam; and
 a second slider movable in the second direction along the beam,
 wherein the first slider is supported movably on the base by a plurality of first static pressure air bearing units disposed at two positions on the lower surface of the T-shaped section, at at least one position on the lower surface of the beam at the central portion thereof and at the two positions on the lower surface of the arm member; and
 the second slider is supported movably on the base by a plurality of second static pressure air bearing units disposed on the lower surface of the second slider at a plurality of positions thereof.

2. An X-Y stage apparatus according to claim 1, wherein the guide rail has a square cross section including two side surfaces each extending in the first direction, the T-shaped section has an approximately inverted-U-shaped cross section including two inner surfaces facing the two side surfaces of the guide rail, and a plurality of third static pressure air bearing units are disposed to each of the two inner surfaces of the T-shaped section facing the two side surfaces of the guide rail.

3. An X-Y stage apparatus according to claim 2, wherein the beam has a square cross section including two side surfaces each extending in the second direction, the X-slider has an approximately inverted-U-shaped cross section including two inner surfaces facing the two side surfaces of the beam, and a plurality of fourth static pressure air bearing units are disposed to each of the two inner surfaces of the X-slider facing the two side surfaces of the beam.

4. An X-Y stage apparatus according to claim 3, wherein the first static pressure air bearing units, which are disposed at two positions on the lower surface of the T-shaped section, are located at positions approximately symmetrical with respect to the central axis of the beam, and the plurality of first static pressure air bearing units, which are disposed at two positions on the lower surface of the arm member, are also located at positions approximately symmetrical with respect to the central axis of the beam.

5. An X-Y stage apparatus according to claim 4, wherein the plurality of second static pressure air bearing units comprise three of static pressure air bearing units located at positions corresponding to the apexes of a regular triangle on the lower surface of the second slider.

6. An X-Y stage apparatus according to claim 5, wherein two of the first static pressure air bearing means are disposed at the central portion of the beam in the width direction thereof at an interval.

7. An X-Y stage apparatus according to claim 5, wherein two of the first static pressure air bearing means are disposed at the central portion of the beam in the length direction thereof at an interval.

* * * * *